(12) United States Patent
Jang et al.

(10) Patent No.: US 9,001,863 B2
(45) Date of Patent: Apr. 7, 2015

(54) GRAPHITE CRUCIBLE FOR ELECTROMAGNETIC INDUCTION MELTING SILICON AND APPARATUS FOR SILICON MELTING AND REFINING USING THE GRAPHITE CRUCIBLE

(75) Inventors: Bo Yun Jang, Daejeon-si (KR); Young Soo Ahn, Daejeon-si (KR); Joon Soo Kim, Daejeon-si (KR); Sang Hyun Park, Daejeon-si (KR); Dong Kook Kim, Daejeon-si (KR); Gwon Jong Yu, Seoul (KR)

(73) Assignee: Korea Institute of Energy Research, Daejeon-Si (KR)

( * ) Notice: Subject to any disclaimer, the term of this patent is extended or adjusted under 35 U.S.C. 154(b) by 66 days.

(21) Appl. No.: 13/123,897

(22) PCT Filed: Nov. 17, 2008

(86) PCT No.: PCT/KR2008/006766
§ 371 (c)(1),
(2), (4) Date: Apr. 12, 2011

(87) PCT Pub. No.: WO2010/044508
PCT Pub. Date: Apr. 22, 2010

(65) Prior Publication Data
US 2011/0192837 A1     Aug. 11, 2011

(30) Foreign Application Priority Data
Oct. 16, 2008   (KR) .......................... 10-2008-0101659

(51) Int. Cl.
*H05B 6/22*     (2006.01)
*C30B 13/14*    (2006.01)

(52) U.S. Cl.
CPC .................................... *C30B 13/14* (2013.01)

(58) Field of Classification Search
CPC ....... F27B 14/061; F27B 14/00; C30B 13/14; C30B 15/10; C30B 11/002; C30B 35/002; C30B 29/06; H05B 6/24
USPC ............ 373/7, 151, 152, 140, 144, 138, 156, 373/146, 142, 155, 157; 219/647, 638, 635, 219/649, 648; 117/13, 208, 217, 901, 206; 164/507, 513, 338.1, 471, 493; 75/10.14, 10.11, 10.15, 10.18, 17.6; 65/441, 425, 355; 266/233, 234
See application file for complete search history.

(56) References Cited

U.S. PATENT DOCUMENTS 3,067,139 A  * 12/1962  Goorissen ........................ 117/31
5,372,090 A    12/1994  Wegmeth et al.
(Continued)

FOREIGN PATENT DOCUMENTS

| CN | 1078548 A | 11/1993 |
| JP | 9263480 A | 10/1997 |

(Continued)

OTHER PUBLICATIONS

International Search Report dated Jun. 3, 2009, for International Application No. PCT/KR2008/006766 (2 pages).

(Continued)

*Primary Examiner* — Tu B Hoang
*Assistant Examiner* — Hung D Nguyen
(74) *Attorney, Agent, or Firm* — Lowe Hauptman & Ham, LLP

(57) ABSTRACT

A graphite crucible for electromagnetic induction-based silicon melting and an apparatus for silicon melting/refining using the same, which performs a melting operation by a combination of indirect melting and direct melting. The crucible is formed of a graphite material and includes a cylindrical body having an open upper part through which a silicon raw material is charged into the crucible, and an outer wall surround by an induction coil, wherein a plurality of first slits are vertically formed through the outer wall and an inner wall of the crucible, and a plurality of second slits are vertically formed from an edge of the disc-shaped bottom of the crucible toward a center of the bottom.

12 Claims, 7 Drawing Sheets

(56) References Cited

U.S. PATENT DOCUMENTS

| | | | |
|---|---|---|---|
| 5,394,432 A * | 2/1995 | Fukuzawa et al. | 373/156 |
| 7,000,678 B1 | 2/2006 | Mon et al. | |
| 7,258,744 B2 | 8/2007 | Sakurada et al. | |
| 2002/0170492 A1 * | 11/2002 | Kubo et al. | 117/208 |
| 2005/0175064 A1 * | 8/2005 | Keough | 373/151 |
| 2006/0037733 A1 | 2/2006 | Mon et al. | |

FOREIGN PATENT DOCUMENTS

| | | |
|---|---|---|
| JP | 2001-019594 A | 1/2001 |
| JP | 2005-179080 A | 7/2005 |
| JP | 2005179080 A | 7/2005 |
| JP | 2005-281085 A | 10/2005 |
| KR | 10-2006-0016659 A | 2/2006 |

OTHER PUBLICATIONS

Chinese Office Action dated Jan. 20, 2014.

S.W. Hong et al., Application of cold crucible for melting of UO2/ZrO2 mixture, Received Oct. 1, 2002, Materials Science and Engineering, Elsevier.

Supplementary European Search Report dated Nov. 25, 2014.

\* cited by examiner ic melting, which can achieve improved silicon melting efficiency by a combination of crucible-heat indirect melting and electromagnetic induction contact-free direct melting.

GRAPHITE CRUCIBLE FOR ELECTROMAGNETIC INDUCTION MELTING SILICON AND APPARATUS FOR SILICON MELTING AND REFINING USING THE GRAPHITE CRUCIBLE

TECHNICAL FIELD

The present invention relates to a crucible for silicon melting and, more particularly, to a graphite crucible for electromagnetic induction-based silicon melting, which can melt semiconductors such as silicon with high efficiency by a combination of crucible-heat indirect melting and electromagnetic induction contact-free direct melting, and an apparatus for melting and refining silicon using the same.

BACKGROUND ART

Electromagnetic induction-based direct melting can rapidly melt metallic materials, thereby ensuring high yield with minimized contamination of raw materials. The electromagnetic induction-based direct melting is generally performed according to the following principle.

When an alternating current is applied to an induction coil wound around a crucible to induce magnetic field variation, an induction current is created on the surface of metal to be melted and generates Joule's heat, which melts the metal. Further, the induction current interacts with a magnetic field to generate the Lorentz force in molten metal.

Since the Lorentz force is always directed toward an inner center of the crucible and provides a pinch effect or electromagnetic pressure effect according to Fleming's left hand rule even when the direction of the current in the coil is varied, it is possible to prevent the molten metal from contacting an inner wall of the crucible.

However, the electromagnetic induction melting cannot be applied when melting semiconductors such as silicon. That is, since silicon has a very high melting point of 1,400° C. or more and a very low electric conductivity at 700° C. or less unlike metals, it is difficult to achieve direct electromagnetic induction-based silicon melting.

When melting the semiconductors such as silicon, indirect melting with heat from a graphite crucible is generally used. Although graphite is a non-metallic material, it has very high electric and thermal conductivity, thereby allowing the crucible to be easily heated through electromagnetic induction.

As known in the art, however, since graphite in the crucible shields electromagnetic waves, an electromagnetic force cannot be delivered into the graphite crucible. Thus, currently, melting the semiconductors such as silicon in the graphite crucible is carried out only by indirect melting with heat from the crucible.

When indirect silicon melting is performed in the graphite crucible, silicon melt contacts the surface of the crucible. Then, the silicon melt reacts with graphite, thereby causing carbon contamination on silicon from the inner surface of the crucible. Furthermore, the reaction between the silicon melt and graphite generates a silicon carbide layer on the inner surface of the crucible, which often causes cleavage of the crucible.

To solve such problems, Japanese Non-Examined Patent Publication No. 2005-281085 (published on Oct. 13, 2005) discloses a technique for silicon carbide (SiC) coating or high density treatment on an inner surface of a graphite crucible which will contact silicon. FIG. 1 shows a cross-section of the graphite crucible, an inner surface of which is coated with SiC.

In FIG. 1, a silicon carbide coating 110 is formed on the inner surface of the graphite crucible and suppresses reaction between graphite and silicon melt. As a result, it is possible to prevent contamination of silicon or the crucible. Furthermore, the suppression of the reaction can prevent thickness growth of a composite layer 120, which has silicon carbide dispersed in a graphite matrix of the composite layer 120, into a graphite base 130, thereby preventing cleavage of the graphite crucible.

However, the SiC coating 110 tends to be exfoliated from the inner surface of the crucible while melting silicon in the crucible, thereby reducing lifespan of the crucible and insufficiently preventing contamination of silicon.

A cold copper crucible can be used to prevent contact between the silicon melt and the inner surface of the crucible during silicon melting. However, although this crucible has a merit of preventing contact between the silicon melt and the crucible by electromagnetic induction, this crucible requires an assistant heat source for forming an initial silicon melt and generally undergoes severe heat loss due to cooling water.

To solve the problems of the cold copper crucible, Japanese Non-Examined Patent Publication No. 2001-19594 (published on Jan. 23, 2001) discloses a technique of using plasma as an assistant heat source. However, this technique complicates structure of a silicon melting apparatus and provides low efficiency due to heat loss of 30% or more through cold copper crucible.

To solve the problems of the graphite crucible and the cold copper crucible, Korean Patent Laid-open Publication No. 10-2006-0016659 (published on Feb. 22, 2006) discloses a crucible which combines the structure of the cold copper crucible (cold crucible) and the graphite crucible (hot crucible). The structure of this crucible is shown in FIG. 2.

In FIG. 2, the disclosed crucible includes a hot crucible 250 formed of a graphite material and disposed on top of a cold copper crucible 220. The hot crucible 250 has a circumferentially integral upper end and plural segments 240 are formed from a lower end of the hot crucible 250 to a lower end of the cold crucible 220 by a plurality of vertical slits 230. The hot crucible 250 is insulated by an insulator 260 to improve silicon heating efficiency and to protect an induction coil 210.

In the crucible of this configuration, after forming an initial silicon melt using the hot graphite crucible 250, a raw material of the initial silicon melt is further heated and melted, with electromagnetic pressure longitudinally exerted to the overall silicon melt and maintained above the hydrostatic pressure of the silicon melt, thereby improving heating and melting efficiency.

Since the disclosed crucible is formed by combining the cold crucible and the hot crucible, it is more difficult to fabricate such a combination type crucible than an integral type crucible such as the graphite crucible and the like. Moreover, as shown in FIG. 2, since the upper hot crucible formed of the graphite material serves only as the assistant heat source and silicon melting is performed substantially by the cold crucible, the crucible inevitably undergoes heat loss due to water cooling.

Furthermore, although the conventional cold copper crucible can prevent the silicon melt from contacting the inner wall of the crucible by the electromagnetic induction melting, it still suffers contamination of silicon or the crucible due to contact between the silicon melt and an inner bottom surface of the crucible.

DISCLOSURE

Technical Problem

An aspect of the present invention is to provide a highly efficient graphite crucible for electromagnetic induction-based silicon melting and an apparatus for melting and refining silicon using the same, which can solve problems caused by contact between a silicon melt and graphite in a typical graphite crucible and can solve a problem of heat loss caused by water cooling in a typical cold copper crucible.

Technical Solution

In accordance with an aspect of the present invention, a graphite crucible for electromagnetic induction-based silicon melting is formed of a graphite material and includes a cylindrical body having an open upper part, through which a silicon raw material is charged into the crucible, and an outer wall surround by an induction coil, wherein a plurality of first slits are vertically formed through the outer wall and an inner wall of the crucible, and a plurality of second slits are vertically formed from an edge of a disc-shaped bottom of the crucible toward a center of the bottom.

In accordance with another aspect of the present invention, an apparatus for melting and refining silicon with a graphite crucible for electromagnetic induction-based silicon melting includes a cylindrical crucible formed of a graphite material and having an open upper part, a plurality of first slits vertically formed through the outer wall and an inner wall of the crucible and a plurality of second slits vertically formed from an edge of a disc-shaped bottom of the crucible toward a center of the bottom, and an induction coil surrounding the outer wall of the crucible, wherein a silicon raw material charged into the crucible through the upper part of the crucible is indirectly melted to form a silicon melt, and the silicon melt is subjected to induction melting without contacting the inner wall and an inner bottom surface of the crucible.

Advantageous Effects

According to an embodiment of the invention, the graphite crucible can be fabricated at low cost and solve problems of contact between a silicon melt and graphite and heat loss by a combination of indirect melting and contact-free electromagnetic induction-based direct melting, thereby achieving highly efficient electromagnetic induction-based silicon melting and high purity refining by agitation of the silicon melt.

BEST MODE

Exemplary embodiments of the present invention will now be described with reference to the accompanying drawings.

Figure 1:
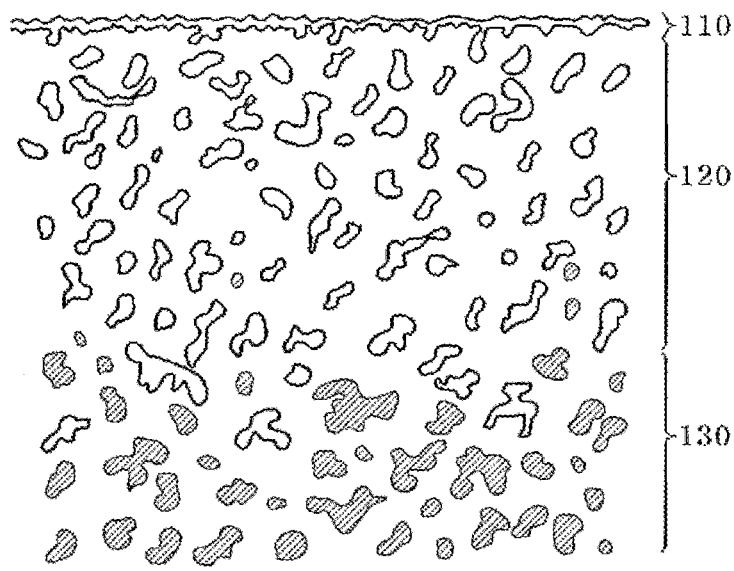
FIG. 1 shows a cross-section of a conventional graphite crucible coated with silicon carbide.
Figure 2:
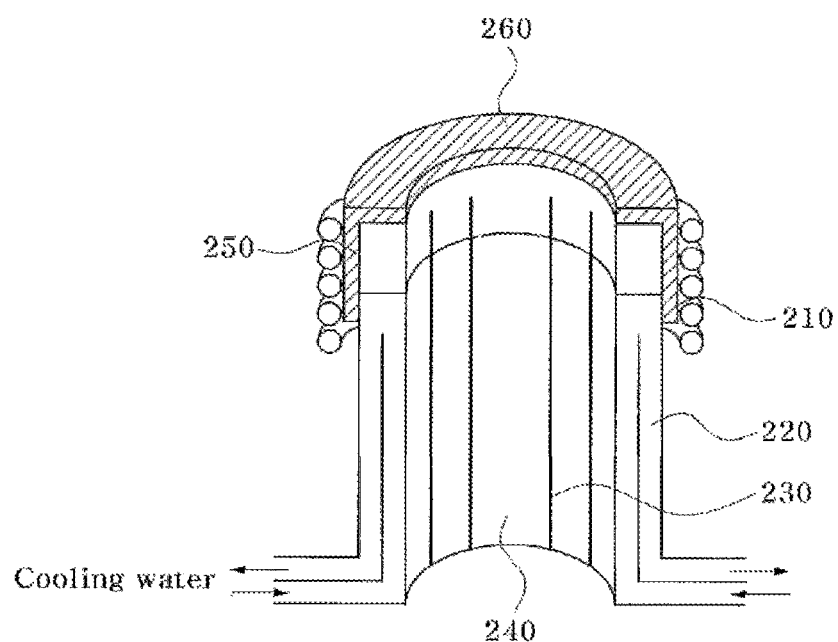
FIG. 2 is a sectional view of a conventional crucible which includes an upper hot crucible disposed on top of a cold crucible.
Figure 3:
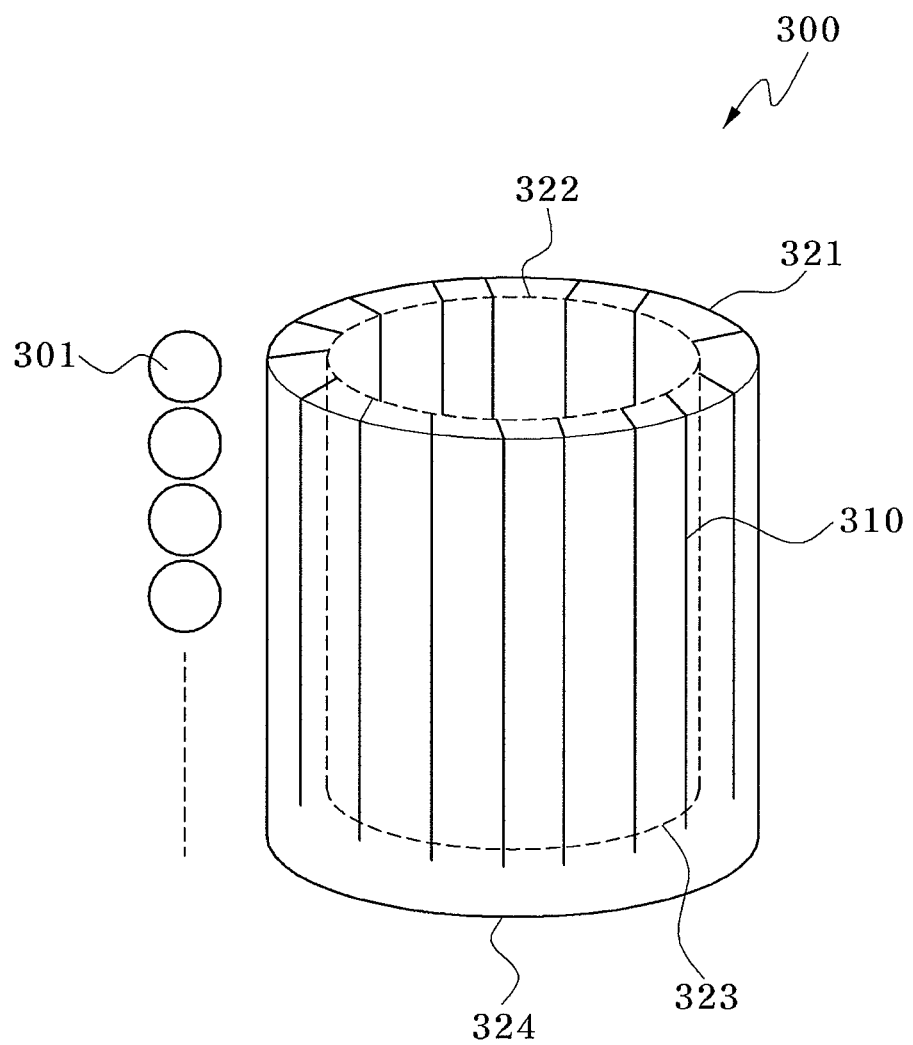
FIG. 3 is a view of a graphite crucible for electromagnetic induction-based silicon melting according to an embodiment of the present invention, in which a plurality of first slits are formed on a wall of the crucible.

FIG. 3 is a view of a graphite crucible for electromagnetic induction-based silicon melting according to an embodiment of the present invention, in which a plurality of first slits are vertically formed on a wall of the crucible.

In FIG. 3, the graphite crucible 300 according to the embodiment includes a cylindrical body which has an open upper part. An outer wall 321 of the crucible is surrounded by an induction coil 301 during a process of melting silicon. A silicon raw material is charged into the crucible through the upper part of the crucible.

Referring to FIG. 3, the crucible 300 has a plurality of first slits 310 vertically formed through an inner wall 322 and the outer wall 321 of the crucible. In typical silicon melting graphite crucibles which have no slit, an electromagnetic force does not substantially act within the crucible because electromagnetic waves are shielded by graphite.

On the contrary, in the crucible having the first plural slits 310 penetrating the inner and outer walls 322 and 321 of the crucible as shown in FIG. 3, the electromagnetic waves are not shielded by graphite so that the electromagnetic force can be intensively exerted into the crucible, as can be seen from test results described below.

Figure 4:
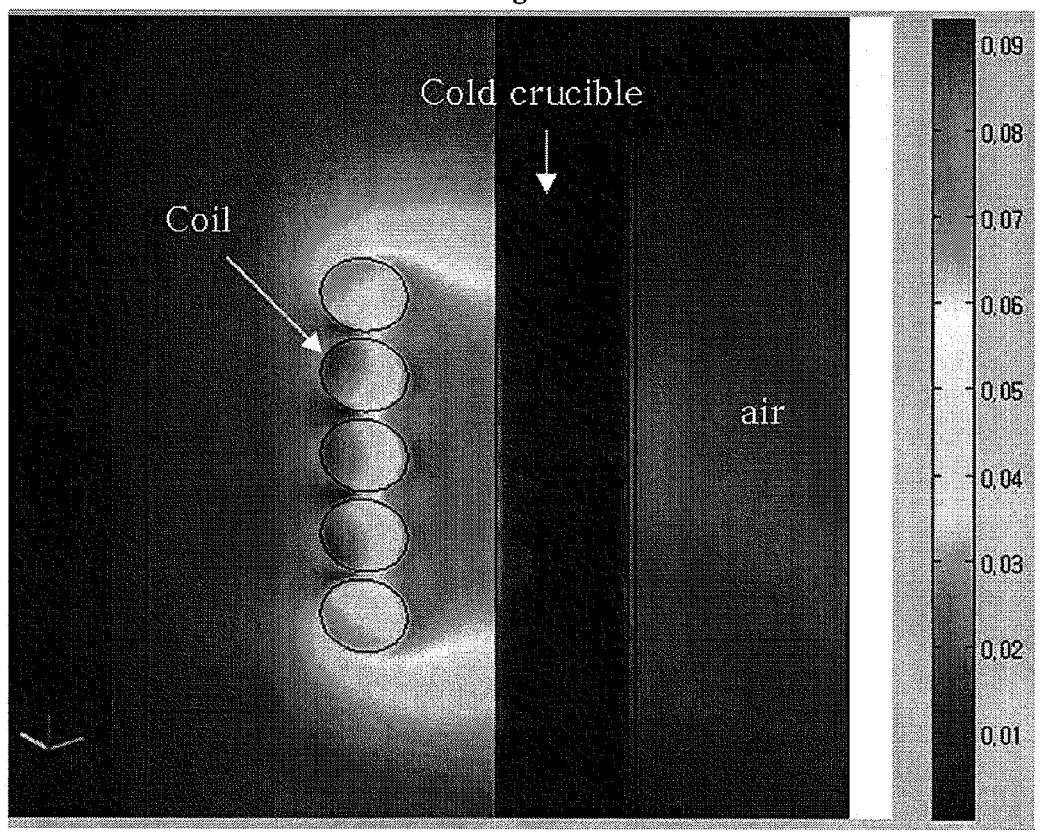
FIGS. 4 and 5 are results of numerical analysis on interior magnetic field density of a conventional cold copper crucible and a graphite crucible according to an example of the present invention, respectively.
Figure 5:
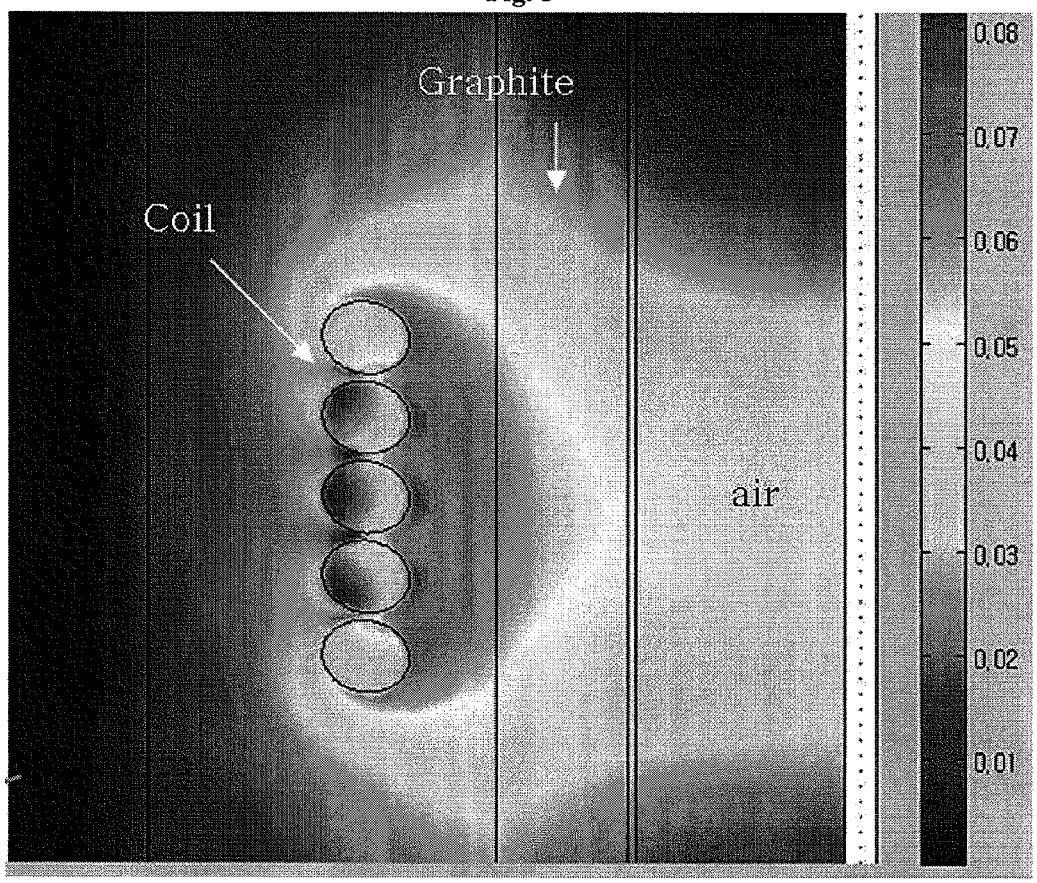

FIGS. 4 and 5 are results of numerical analysis on interior magnetic field density of a conventional cold copper crucible and a graphite crucible according to an example of the present invention, respectively. It can be seen from FIGS. 4 and 5 that the graphite crucible having first plural slits (FIG. 5) has a higher interior magnetic field density than the conventional cold copper crucible (FIG. 4). This means that the first plural slits vertically formed in the graphite crucible enable the electromagnetic force to be further intensively exerted toward the inner center of the crucible.

Therefore, the electromagnetic force created by an electric current flowing in the induction coil 301 acts toward the inner center of the crucible and prevents silicon melt from contacting the inner wall 322 of the crucible.

Even when the electromagnetic force is exerted toward the inner center of the crucible, the electromagnetic force less than a hydrostatic pressure caused by gravity causes the silicon melt to spread. Thus, the electromagnetic force must be higher than the hydrostatic pressure in the direction of the inner center of the crucible.

Figure 6:
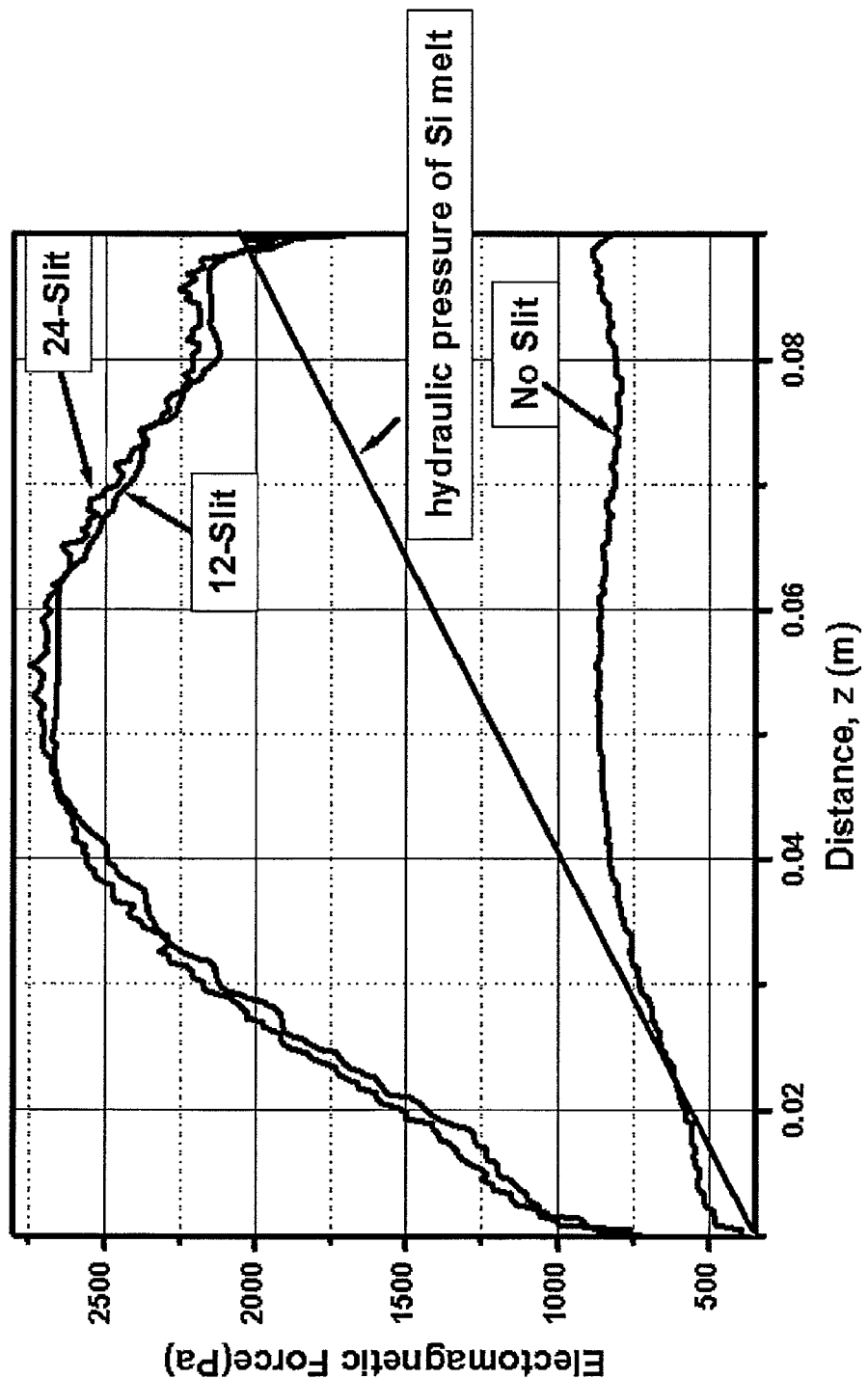
FIG. 6 is a graph depicting a result of numerical analysis on hydrostatic pressure and electromagnetic pressure acting on silicon melt in a graphite crucible including a plurality of first slits according to an example of the present invention.

FIG. 6 is a graph depicting hydrostatic pressure and electromagnetic pressure acting on a silicon melt in the vertical direction within the graphite crucible according to the embodiment of the present invention. It can be seen from FIG. 6 that the electromagnetic pressure acting on the silicon melt is lower than the hydrostatic pressure when the graphite crucible has no slit. In this case, it is substantially impossible to achieve contact-free silicon melting.

On the other hand, in the graphite crucible formed with 12 or 24 slits, the electromagnetic pressure acting toward the inner center of the crucible is higher than the hydrostatic pressure which causes the silicon melt to spread.

The first plural slits 310 may be formed from the upper part of the crucible to a lower surface 324 thereof. Alternatively, the first plural slits 310 may be formed from the upper part of the crucible to an inner bottom surface 323 of the crucible.

In order to allow the electromagnetic force to prevent silicon melt from contacting the inner wall 322 of the crucible, there is a need to allow the electromagnetic force to act toward the inner center of the crucible. For this purpose, the first plural slits 310 may be uniformly arranged and separated at constant intervals from each other such that segments divided by the slits 310 may have the same size.

Further, in order to allow the electromagnetic force to act toward the inner center of the crucible, the plurality of first slits 310 may be radially (that is, in the direction of the center) formed in the crucible.

Since the silicon melt contacts the inner bottom surface 323 of the crucible, there is a need to prevent the silicon melt from contacting graphite in the bottom surface of the crucible. For this purpose, according to an embodiment of the invention, plural second slits are formed in the disc-shaped bottom of the crucible.

Figure 7:
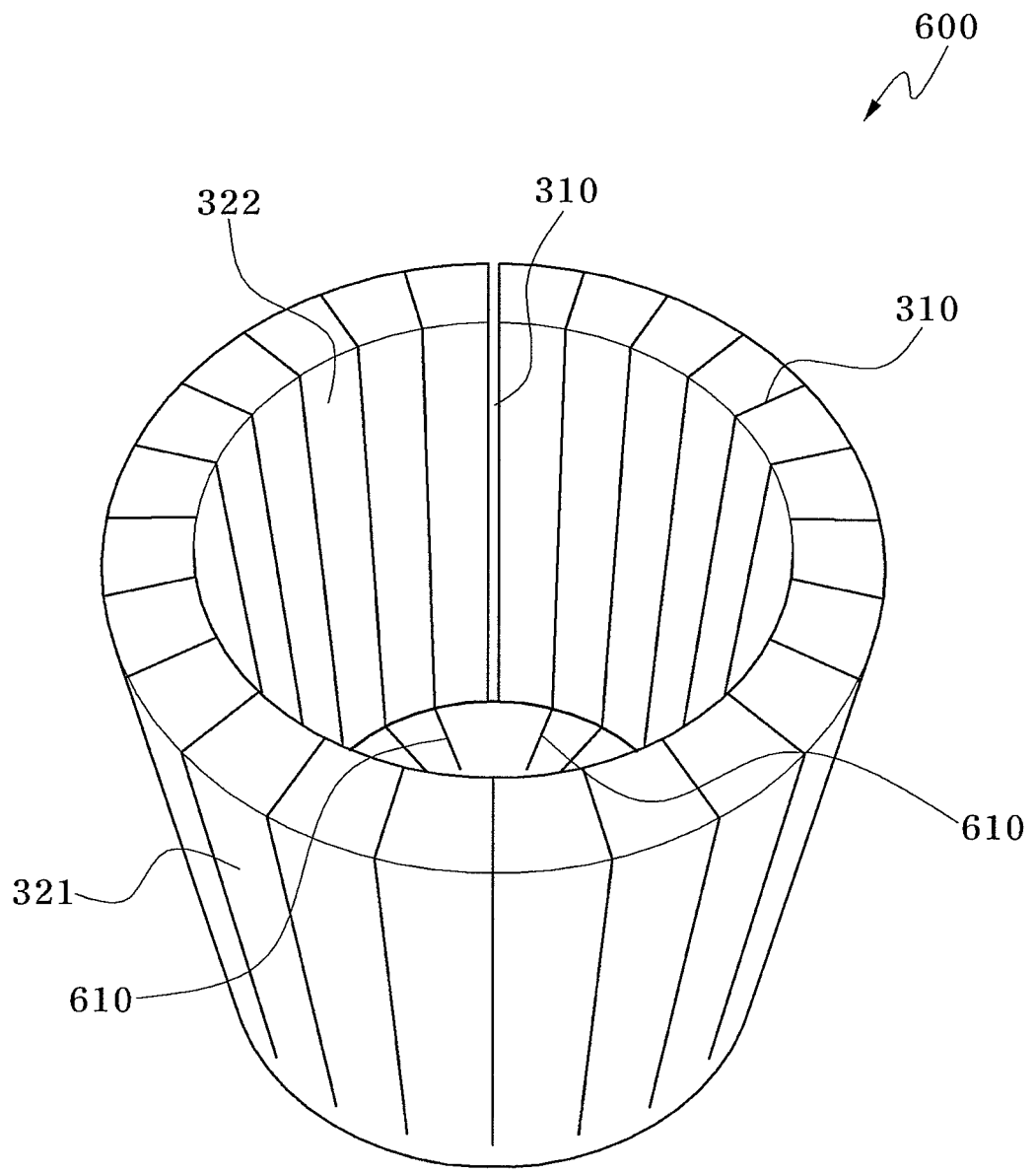
FIG. 7 is a perspective view of a graphite crucible for electromagnetic induction-based silicon melting according to another embodiment of the present invention.

FIG. 7 is a perspective view of a graphite crucible for electromagnetic induction-based silicon melting according to another embodiment of the present invention.

Referring to FIG. 7, the graphite crucible 600 according to this embodiment has a plurality of first slits 310 vertically formed through an inner wall 322 and the outer wall 321 of the crucible, and a plurality of second slits 610 vertically formed from an edge 810 of a bottom 800 (see FIG. 9) of the crucible toward a center 820 of the bottom.

The second plural slits 610 formed on the bottom 800 of the crucible serve to distribute an eddy current which gathers from the first plural slits 310 on the wall of the crucible to the bottom. Here, since the eddy current created by an external electromagnetic field flows on the inner wall 322 and the inner bottom 323 of the crucible, the second plural slits 610 can prevent the lower silicon melt from contacting the bottom surface even when the bottom surface is not completely cut to form the second slits as in the outer wall 321.

Figure 8:
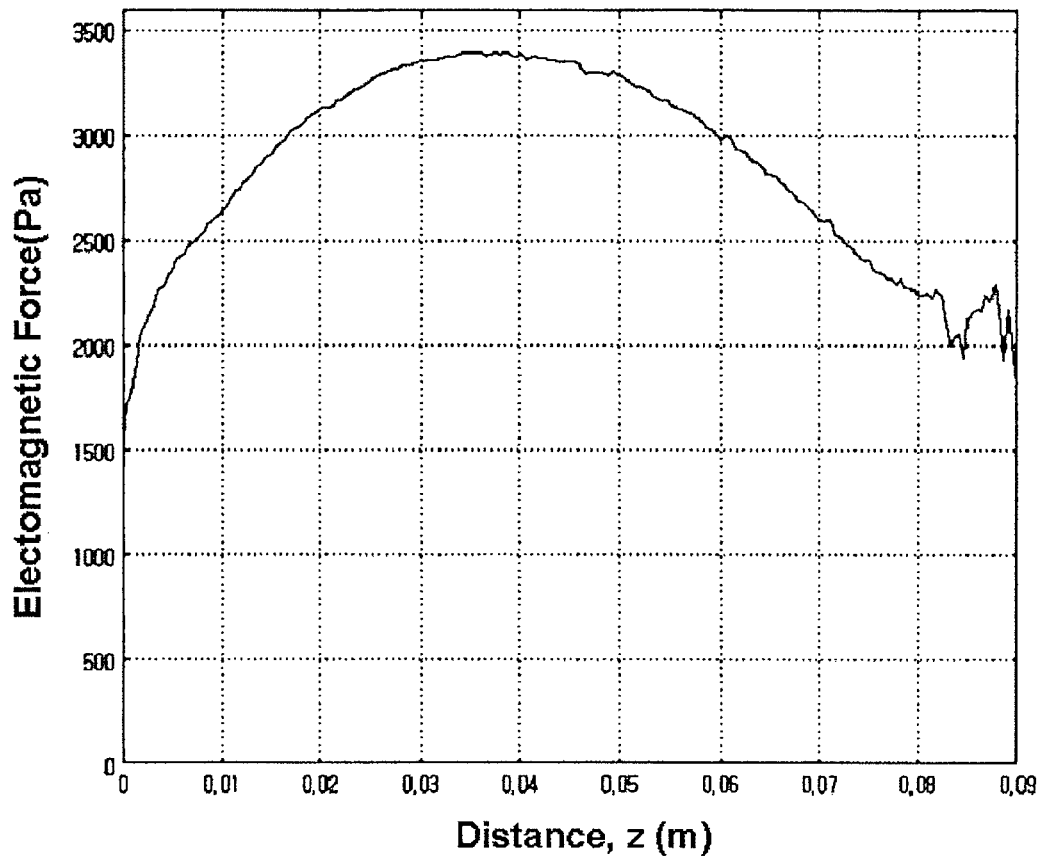
FIG. 8 is a graph depicting a result of numerical analysis on electromagnetic pressure acting on silicon melt in a graphite crucible including second slits on the bottom thereof according to an example of the present invention.

FIG. 8 is a graph depicting a result of numerical analysis on electromagnetic pressure acting on silicon melt in a graphite crucible including second slits on the bottom thereof according to an example of the present invention. It can be seen from FIG. 8 that the second slits 610 on the bottom 800 of the crucible provides a sufficiently higher electromagnetic force than the hydrostatic pressure of the silicon melt as in the crucible having no second slit on the bottom, even when the bottom surface is not completely cut to form the second slits as in the outer wall 321.

Figure 9:
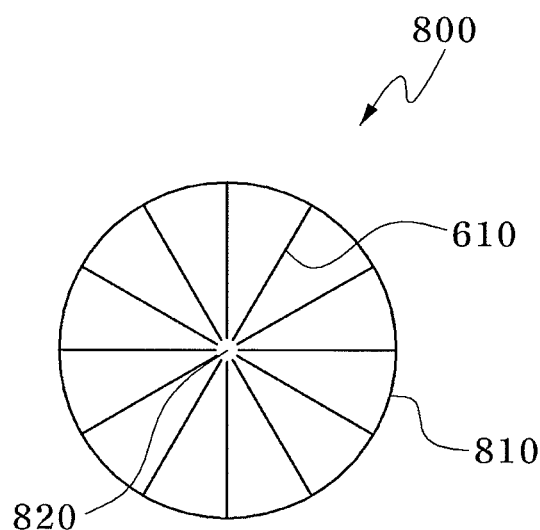
FIG. 9 shows an example of the second slits formed on the bottom of the graphite crucible shown in FIG. 7.

Here, as shown in FIG. 9, all of the second slits 610 are disconnected from each other on the center 820 of the bottom, where an imaginary cross point of the second slits 610 is present, to prevent eddy current from concentrating on the center. Such a disconnected part on the center 820 of the bottom prevents concentration of the eddy current, thereby preventing rapid temperature increase on the center of the bottom.

FIG. 9 shows an example of the second slits formed on the bottom of the graphite crucible shown in FIG. 7. Here, the bottom 800 of the crucible has a disc shape, and an upper surface of the bottom constitutes the inner bottom surface 323 of the crucible and a lower surface thereof constitutes a lower surface 324 of the crucible.

Referring to FIG. 9, the second plural slits 610 are formed from the edge 810 of the bottom 800 toward the center 820 thereof where the second plural slits 610 are necessarily disconnected from each other. Like the first slits 310, the second slits 610 may be separated at constant intervals from each other. In some cases, some or all of the first slits 310 may be connected to some or all of the second slits 610.

Next, a process of melting silicon in the graphite crucible 600 according to this embodiment will be described.

When an electric current is applied to the induction coil 301 wound around the outer wall 321 of the graphite crucible, the crucible undergoes induction heating. Then, a silicon raw material charged into the crucible is indirectly melted on the bottom of the crucible by heat from the induction-heated crucible, and forms a silicon melt of about 1,400~1,500° C. after a predetermined duration.

Since silicon exhibits as high electric conductivity as metals at or above the melting point thereof, the silicon melt formed by indirect melting moves upward during induction melting, whereby agitation of the silicon melt occurs. Further, the silicon melt undergoes direct electromagnetic induction melting without contacting the inner wall 322 of the crucible by the electromagnetic force acting toward the inner center of the crucible. Further, the plurality of second slits 610 are formed from the edge 810 of the bottom 800 toward the center 820 thereof, so that an eddy current is distributed on the bottom surface 323 of the crucible so as not to concentrate on the bottom 800 of the crucible, thereby preventing the silicon melt from contacting the bottom surface 323 of the crucible.

The completely molten silicon does not contact the inner wall 322 of the crucible, and continuous agitation occurs in the molten silicon to force impurities to move to the surface of the molten silicon. As a result, highly pure silicon can be obtained.

The graphite crucible for electromagnetic induction-based silicon melting according to the present invention may be applied to an apparatus for melting and refining silicon. In this case, the apparatus includes the graphite crucible 600 shown in FIG. 7 and an induction coil 301 wound around the outer wall 321 of the crucible.

Melting and refining of silicon are performed by electromagnetic induction melting, and more particularly by a combination of indirect melting and direct melting as follows.

In melting and refining of silicon, a silicon raw material charged into the crucible through the open upper part of the crucible is indirectly melted to form a silicon melt by heat from the crucible, which undergoes induction heating by an electric current flowing in the induction coil 301. Then, the silicon melt is subjected to induction melting without contacting the inner wall 322 of the crucible by the electromagnetic force which is created by the current flowing in the induction coil 301 and acts toward the inner center of the crucible. Further, the second plural slits 610 formed on the bottom 800 of the crucible serve to distribute eddy current concentrating on the bottom 800, thereby preventing the silicon melt from contacting the bottom surface 323 of the crucible.

Here, since the formation of the silicon melt from the silicon raw material is achieved by heat from the graphite crucible, it can be referred to as indirect melting, and induction melting of the silicon melt without contacting the inner wall 322 of the crucible can be referred to as direct melting.

The apparatus for melting and refining silicon according to the embodiment of the invention can be fabricated at low costs and prevent contamination of silicon or the crucible by achieving contact-free melting on the inner wall 322 and the inner bottom surface 323 of the crucible. Further, since indirect melting is performed by heat from the graphite crucible at an initial melting stage, there is no need for an additional heat source. Furthermore, since the crucible is formed of a graphite material, there is no problem of heat loss.

Although some embodiments have been provided to illustrate the present invention, it will be apparent to a person skilled in the art that various modifications or changes can be made without departing from the spirit and scope of the present invention. Therefore, the scope of the present invention should be limited only by the following claims.

The invention claimed is:

1. A graphite crucible for electromagnetic induction-based silicon melting, the crucible being formed of a graphite material and comprising a cylindrical body having an open upper part through which a silicon raw material is charged into the crucible, and an outer wall surrounded by an induction coil,
   wherein a plurality of first slits is vertically formed through the outer wall and an inner wall of the crucible, and a plurality of second slits is vertically formed from an edge of a disc-shaped bottom of the crucible toward a center of the bottom,
   wherein the center of the bottom is solid and is integral with a portion of the bottom contacting the inner wall,
   wherein each second slit of the plurality of second slits are disconnected from each other second slit of the plurality of second slits for preventing eddy current from concentrating on the center of the bottom and for preventing rapid temperature increase on the center of the bottom, and
   wherein at least one second slit of the plurality of second slits is disconnected from each first slit of the plurality of first slits, and at least one second slit of the plurality of second slits is connected to at least one first slit of the plurality of first slits.

2. The graphite crucible according to claim 1, wherein each of the plurality of first slits is formed from a top of the crucible to a bottom portion of the crucible.

3. The graphite crucible according to claim 1, wherein the plurality of first slits and the plurality of second slits are arranged at constant intervals.

4. The graphite crucible according to claim 1, wherein each of the plurality of first slits is formed toward an inner center of the crucible.

5. The graphite crucible according to claim 1, wherein the silicon raw material is indirectly melted to form a silicon melt by the crucible undergoing induction heating.

6. The graphite crucible according to claim 5, wherein the silicon melt is subjected to induction melting while being prevented from contacting the inner wall of the crucible by an electromagnetic force created by an electric current flowing in the induction coil and acting toward an inner center of the crucible.

7. The graphite crucible according to claim 1, wherein each of the second slits has a length longer than half of the radius of the disc-shaped bottom.

8. An apparatus for melting and refining silicon with a graphite crucible for electromagnetic induction-based silicon melting, the apparatus comprising:
   a cylindrical crucible formed of a graphite material, and having an open upper part, a plurality of first slits vertically formed through an outer wall and an inner wall of the crucible, and a plurality of second slits vertically formed from an edge of a disc-shaped bottom of the crucible toward a center of the bottom, wherein the center of the bottom is solid and is integral with a portion of the bottom contacting the inner wall; and
   an induction coil surrounding the outer wall of the crucible,
   wherein a silicon raw material charged into the crucible through the open upper part of the crucible is indirectly melted to form a silicon melt, and the silicon melt is subjected to induction melting without contacting the inner wall and an inner bottom surface of the crucible,
   wherein at least one second slit of the plurality of second slits is disconnected from each first slit of the plurality of first slits, and at least one second slit of the plurality of second slits is connected to at least one first slit of the plurality of first slits, and
   wherein each second slit of the plurality of second slits are disconnected from each other second slit of the plurality of second slits for preventing eddy current from concentrating on the center of the bottom and for preventing rapid temperature increase on the center of the bottom.

9. The apparatus according to claim 8, wherein each of the plurality of first slits is formed from the upper part of the crucible to an inner bottom surface thereof.

10. The apparatus according to claim 8, wherein the plurality of first slits and the plurality of second slits are arranged at constant intervals.

11. The apparatus according to claim 8, wherein each of the plurality of first slits is formed toward an inner center of the crucible.

12. The apparatus according to claim 8, wherein each of the second slits has a length longer than half of the radius of the disc-shaped bottom.

* * * * *